(12) United States Patent
Perner

(10) Patent No.: US 6,850,430 B1
(45) Date of Patent: Feb. 1, 2005

(54) REGULATING A MAGNETIC MEMORY CELL WRITE CURRENT

(75) Inventor: Frederick A. Perner, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/725,746

(22) Filed: Dec. 2, 2003

(51) Int. Cl.$^7$ .............................................. G11C 11/00
(52) U.S. Cl. ........................ 365/158; 365/171; 365/173
(58) Field of Search ................................ 365/158, 171, 365/173

(56) References Cited

U.S. PATENT DOCUMENTS

| | | |
|---|---|---|
| 6,606,262 B2 | 8/2003 | Perner |
| 6,791,874 B2 * | 9/2004 | Tran et al. .................. 365/158 |
| 2004/0196693 A1 * | 10/2004 | Iwata .......................... 365/158 |

* cited by examiner

Primary Examiner—Son Mai
(74) Attorney, Agent, or Firm—Brian R. Short

(57) ABSTRACT

The invention includes an apparatus and method for regulating a magnetic memory cell write current. The method includes modifying a magnetic memory cell write current by summing a write current offset to the magnetic memory cell write current, and determining whether writing to a magnetic memory cell with the modified magnetic memory cell write current results in a write error condition. If a write error condition exists, then the method includes incrementing the magnetic memory cell write current, or decrementing the magnetic memory cell write current, until the write error condition is eliminated.

44 Claims, 14 Drawing Sheets

REGULATING A MAGNETIC MEMORY CELL WRITE CURRENT

CROSS-REFERENCE TO RELATED APPLICATION

This patent application is related to U.S. Patent Application to Fred Perner, entitled "An Apparatus and Method for Generating a Write Current for a Magnetic Memory Cell", having U.S. Ser. No. 10/658,442, filed on Sep. 8, 2003.

FIELD OF THE INVENTION

The invention relates generally to electronic memory. More particularly, the invention relates to an apparatus and method for regulating a magnetic memory cell write current.

BACKGROUND OF THE INVENTION

Non-volatile memory is memory that retains its content (data) even when power connected to the memory is turned off. Magnetic random access memory (MRAM) is a type of non-volatile memory. A logical state, or bit, is stored in MRAM by setting magnetic field orientations of MRAM cells within the MRAM. The magnetic field orientations remain even when power to the MRAM cells is turned off.

FIG. 1 shows an MRAM cell 100. The MRAM memory cell 100 includes a soft magnetic region 120, a dielectric region 130 and a hard magnetic region 110. The orientation of magnetization within the soft magnetic region 120 is non-fixed, and can assume two stable orientations as shown by the arrow M1. These two orientations, are either parallel or anti-parallel to the magnetic orientation of the hard magnetic region 110, and determine the logical state of the MRAM memory cell 100. The hard magnetic region 110 (also referred to as a pinned magnetic region) has a fixed magnetic orientation as depicted by the arrow M2. The dielectric region 130 generally provides electrical insulation between the soft magnetic region 120 and the hard magnetic region 110.

The MRAM memory cell is generally located proximate to a crossing point of a word line (WL) and a bit line (BL). The magnetic orientations of the MRAM memory cells are set (written to) by controlling the directions of electrical currents flowing through the word lines and the bit lines, and therefore, by the corresponding magnetic fields induced by the electrical currents. Additionally, the write lines can also be used to read the logic value stored in the memory cells.

The MRAM memory cells are read by sensing a resistance across the MRAM memory cells. The resistance is sensed through the word lines and the bit lines. Generally, the resistance (and therefore, the logical state) of a magnetic memory cell depends on the relative orientations of magnetization in the data layer and the reference layer. For example, the magnetic memory cell is in a state of low resistance if the overall orientation of the magnetization in its data storage layer is parallel to the pinned orientation of magnetization of the reference layer. Conversely, the tunneling junction memory cell is in a high resistance if the overall orientation of magnetization in its data storage layer is anti-parallel to the pinned orientation of magnetization of the reference layer. The magnitude of the switching field required to switch the state of the magnetic memory cells can change over time, further complicating processes for switching the states of the magnetic memory cells.

FIG. 2 shows an array 210 of MRAM memory cells. Bit line and word line selections are made by a row decoder 220 and a column decoder 230, which select a memory cell by conducting current through a selected bit line (BL) and a selected word line (WL). For example, a memory cell 250 is selected by conducting current though a selected bit line 260 and a selected word line 270. The induced magnetic fields should be great enough to reliably set the orientation of magnetization of the selected memory cells of the array of MRAM memory cells 210. The logical states of the memory cells are sensed through corresponding word lines and bit lines by a sense amplifier 240.

The array 210 of MRAM memory cells can suffer from half-select errors when writing to the memory cells. Writing to the memory cells includes selecting a particular bit line (BL), and selecting a particular word line (WL). A half-select error occurs when a memory cell associated with a selected bit line and a non-selected word line changes states, or when a memory cell associated with a non-selected bit line and a selected word line changes states. Clearly, half-select errors degrade the performance of MRAM memory. The write current to the memory cells should be controlled from being so large that excessive half-select errors occur.

The magnitude of applied write current that causes half-select errors can change over time: due to aging and temperature variations. This adds further complexity to writing to an array of magnetic memory cells while minimizing half-select errors.

It is desirable to minimize half-select errors of MRAM memory cells within arrays of MRAM memory cells over time. Additionally, it is desirable ensure that write operations to the MRAM memory cells are consistent and reliable.

SUMMARY OF THE INVENTION

The invention includes an apparatus and method of writing to magnetic memory cells. The apparatus and method minimizes half-select errors while still providing write operations to the MRAM memory cells that are consistent and reliable over time.

An embodiment of the invention includes an apparatus for writing to memory cells. The apparatus includes a write current generator for generating a write current that is coupled to an array of memory cells. A threshold detector feeds back an indicator to the write current generator if the write current is one of greater than a maximum write current threshold or less than a minimum write current threshold.

Other aspects and advantages of the present invention will become apparent from the following detailed description, taken in conjunction with the accompanying drawings, illustrating by way of example the principles of the invention.

DETAILED DESCRIPTION

The invention includes an apparatus and method of writing to magnetic memory cells. The apparatus and method minimizes half-select errors while still providing write operations to the MRAM memory cells that are consistent and reliable over time.

Figure 1:
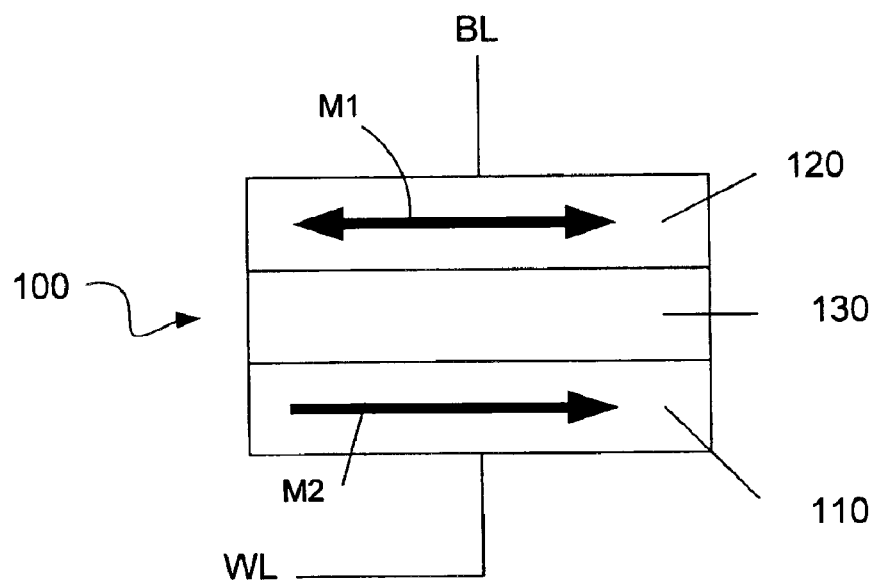
FIG. 1 shows a prior art MRAM memory cell.
Figure 2:
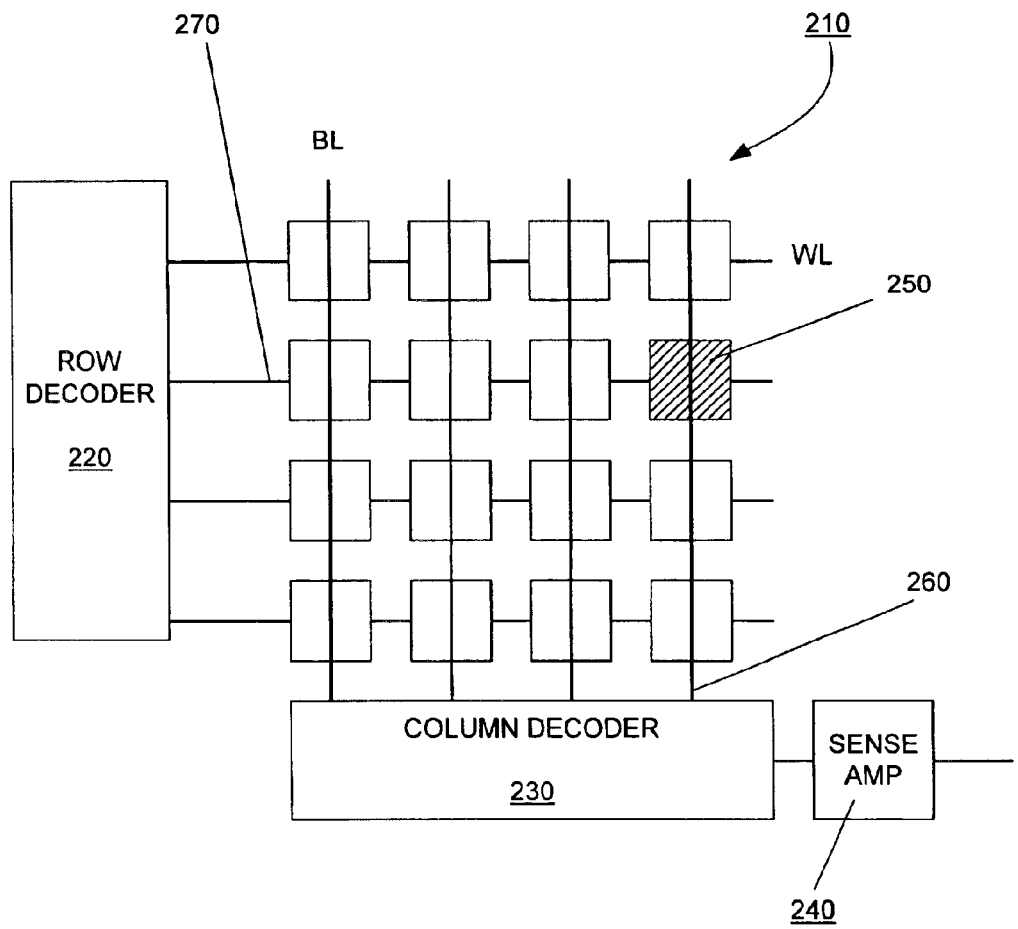
FIG. 2 shows an array of MRAM memory cells.
Figure 3:
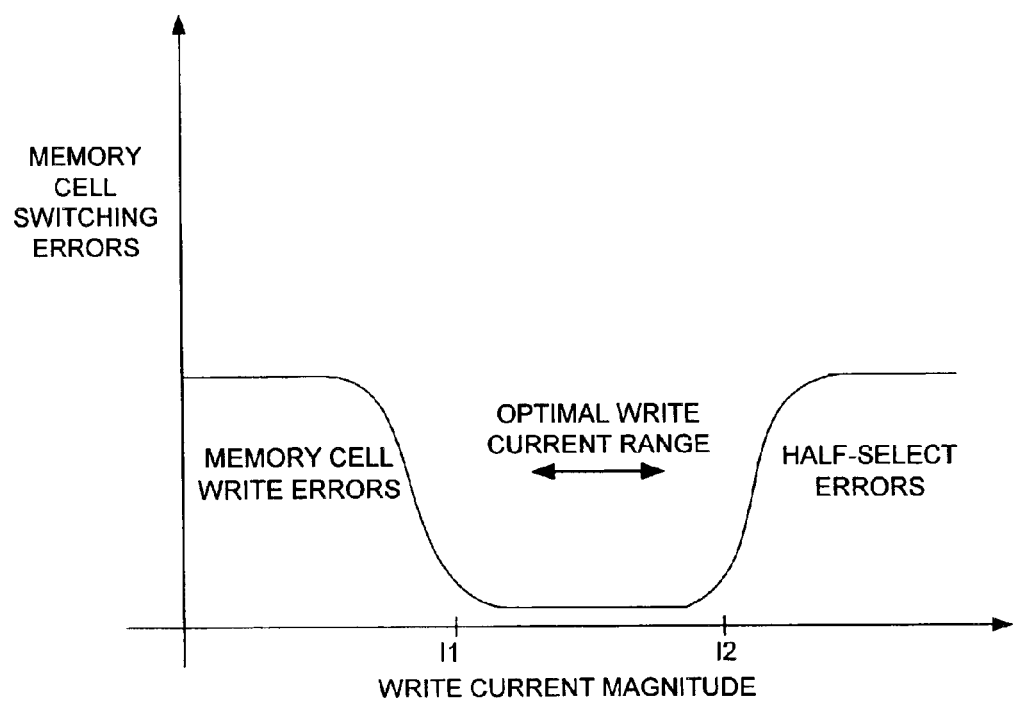
FIG. 3 is a plot showing a relationship between magnetic memory write current and possible memory write errors.

FIG. 3 is a plot showing a relationship between magnetic memory write current and possible magnetic memory write errors. FIG. 3 also shows that when the write current is below a first threshold current (I1), then memory cell write errors occur. If the write current is below the first threshold (I1), the magnetic field created by the write current is too small to consistently write to the memory cells.

FIG. 3 shows that if the write current to a magnetic memory cell within an array of magnetic memory cells is greater than a second threshold current (I2), then magnetic memory cells within the array are likely to suffer from half select errors. Half-select errors occur when a memory cell associated with a selected bit line and a non-selected word line changes states, or when a memory cell associated with a non-selected bit line and a selected word line changes states. Generally, half-select errors occur when the magnitude of the write current is too large, and more memory cells than the desired memory cell are magnetically induced to change states.

As suggested by FIG. 3, there is generally an optimal range of write current for magnetic memory cells within an array of magnetic memory cells. The optimal range is great enough to reliably write to a magnetic memory cell, but low enough to minimize half-select errors within the array of magnetic memory cells.

Figure 4:
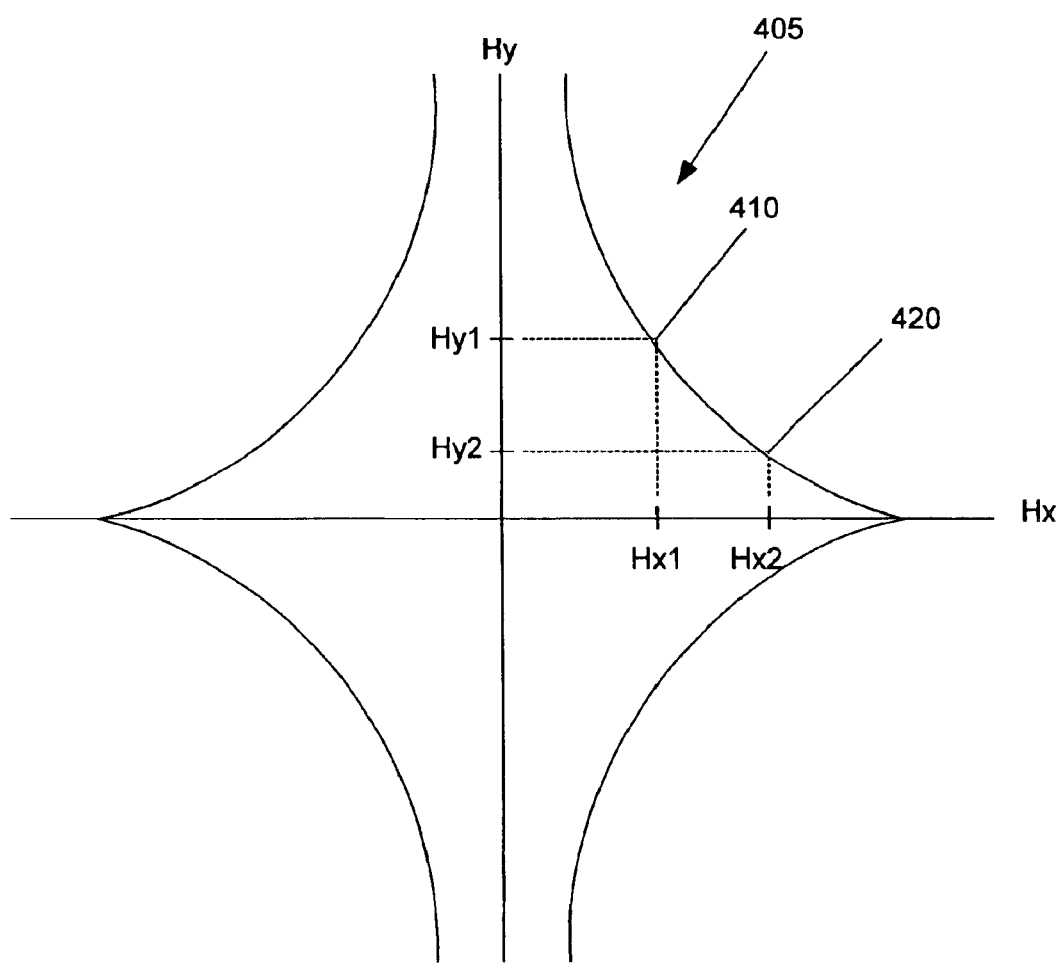
FIG. 4 is a plot showing an intensity of externally applied magnetic fields required to cause an MRAM memory cell to change states.

FIG. 4 is a plot showing an intensity of externally applied magnetic fields required to cause an MRAM memory cell to change state. A first axis of the plot is an Hx axis and a second axis of the plot is an Hy axis. Generally, an X-axis of the described magnetic tunnel junction memory cells corresponds with the longest cross-sectional dimension of the magnetic tunnel junction memory cells, and therefore, the most stable magnetic orientation of the magnetic tunnel junction memory cells. As a result, two stable magnetic orientations of the magnetic tunnel junction cells are parallel and antiparallel to the X-axis of the memory cells.

FIG. 4 shows the magnetic field intensity required to "flip" or change the magnetic orientation of the soft magnetic region of the magnetic memory cell. For example, a first quadrant 405 of the plot of FIG. 4 shows the required Hx magnetic field to cause the MRAM memory cell to change magnetic states for various values of applied Hy magnetic field. A first switch point 410 suggests a first level $Hx_1$ of required Hx magnetic field intensity to change the magnetic state of the memory cell for a first level $Hy_1$ of Hy magnetic filed intensity. A second switch point 420 suggests a second level $Hx_2$ of required Hx magnetic field intensity to change the magnetic state of the memory cell for a second level $Hy_2$ of Hy magnetic field intensity. The required $Hx_2$ magnetic field intensity of the second switch point 420 is greater than the required $Hx_1$ magnetic field intensity of the first switch point 410.

Information regarding the Hy, Hx switching characteristics of the magnetic memory cells can be used to select Hy, Hx magnetic fields that minimize half-select errors. More specifically, increasing the Hy magnetic field of a selected memory cell decreases the Hx magnetic field required to write to the magnetic memory cell. Therefore, other non-selected magnetic memory cells within an array of magnetic memory cells include an Hy magnetic field that is negligible, and therefore, require a greater Hx magnetic field to cause a change in state. Selected memory cells should include a write current that includes an Hy magnetic field that is as great (the maximum level of Hy magnetic field is generally limited by power dissipation) as is reasonably possible to minimize half-select errors.

The Hy, Hx switching characteristics of the magnetic memory cells can also be used to minimize write errors. More specifically, for a selected Hy, an Hx magnetic field is selected to ensure proper writing to the selected memory cell. That is, an Hx magnetic field is selected that is great enough to provide reliable writing to the selected magnetic memory cell. However, the Hx magnetic field cannot be so great that half-select errors occur.

Figure 5:
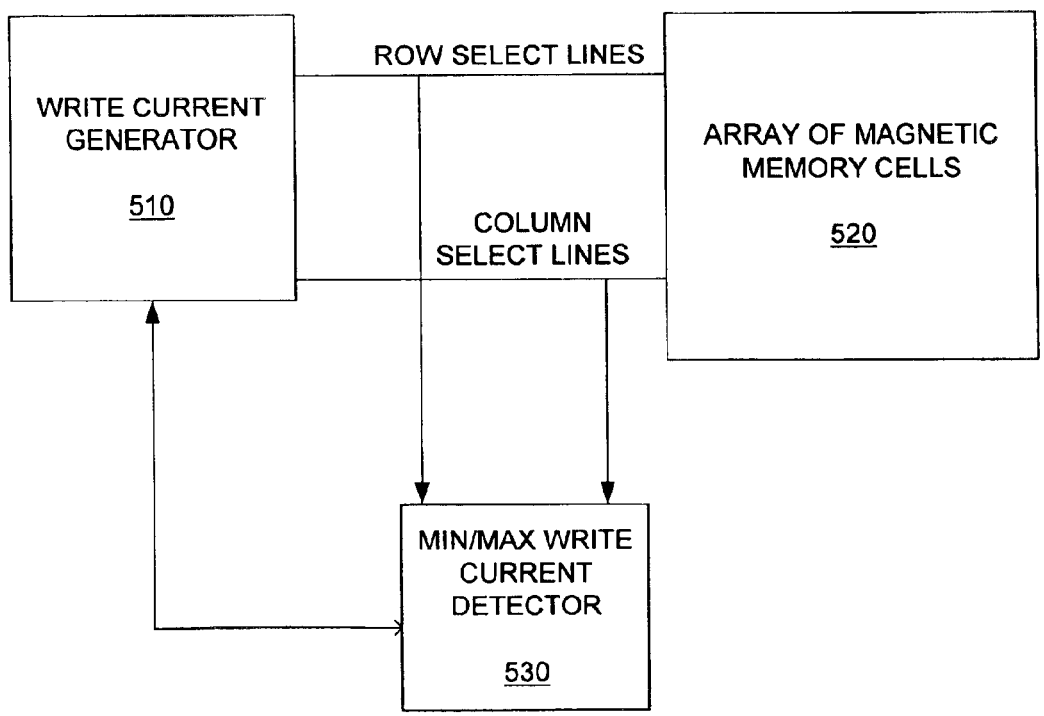
FIG. 5 shows one memory array write mechanism that implements principles of the invention.

FIG. 5 shows one exemplary embodiment of an apparatus for regulating a write current for a magnetic memory cell. In this embodiment, a write current regulator includes a write current generator 510 for generating a write current that is coupled to an array of memory cells 520. This embodiment further includes a threshold detector 530 for feeding back an indicator to the write current generator 510 if the write current is greater than a maximum write current threshold or less than a minimum write current threshold.

One embodiment of the threshold detector 530 determines whether the write current is greater than a maximum write current threshold or less than a minimum write current threshold by summing a write current offset to the write current and determining whether a write error occurs. The write current offset increases the write current to determine, whether a magnitude of the write current should be decreased, and decreases the write current to determine whether the magnitude of the write current should be increased. If a write error occurs (either an incorrect write or a half-select error) the write current is either incremented or decremented until the error condition is eliminated.

Figure 6:
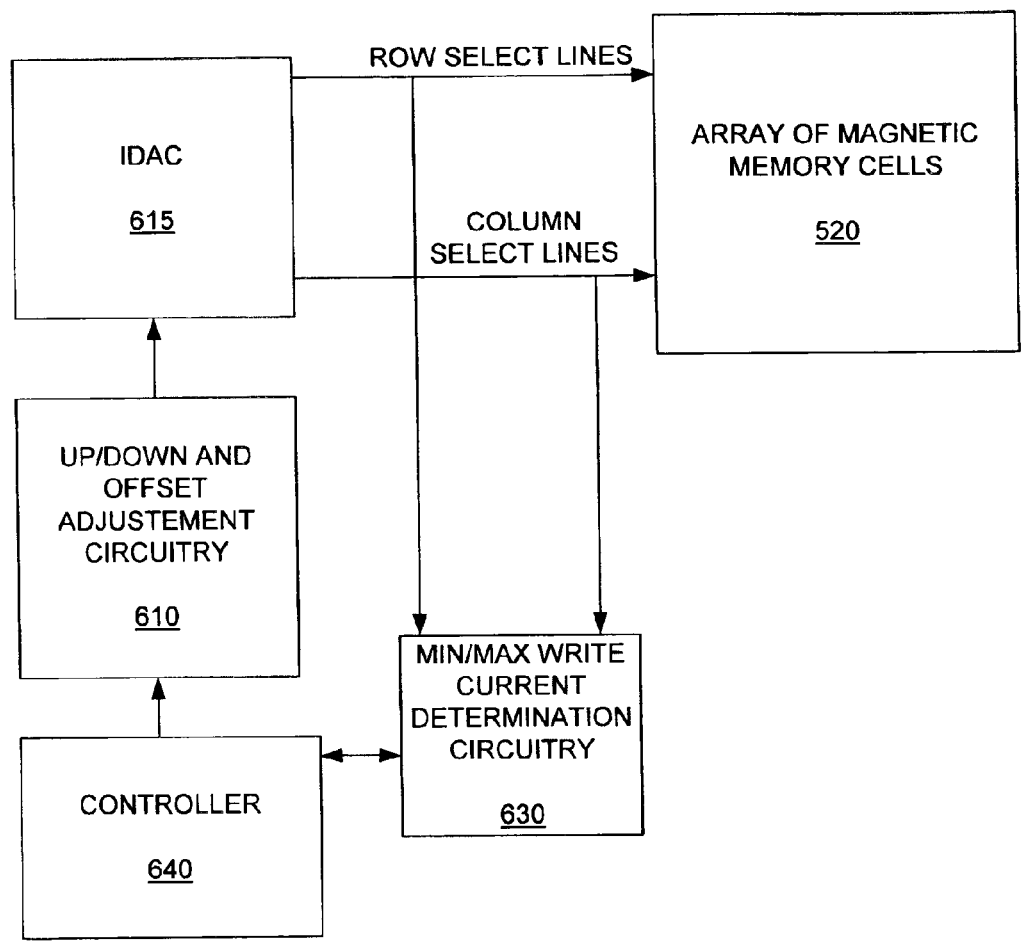
FIG. 6 shows memory array write mechanism that implements additional principles of the invention.

FIG. 6 shows an embodiment similar to FIG. 5, but where one write current regulation circuit is presented in additional detail. In this embodiment, a write current generator includes an up/down counter 610 that sets a magnitude of the write current. Generally, the up/down counter 610 also includes offset adjustment circuitry that can be used to perform write current regulating tests. Depending upon row select lines and column select lines, the write current may be provided to any memory cell within an array of magnetic memory cells 520.

The embodiment of FIG. 6 also includes minimum and maximum write current determination circuitry 630. The write current controlled by the up/down counter 610 is coupled to the write current determination circuitry 630, which detects non-optimal write current levels (either too large or too small) and enables a controller 640 to feedback the detection of non-optimal write current to the write current generator to more reliably control the write current and maintain a magnitude of the write current within a minimal write error range. The minimal write error range is the range of write current magnitude in which the magnitude of the write current is great enough to provide reliable writing to a selected memory cell within the array of magnetic memory cells 520, but small enough that half select errors within the array of magnetic memory cells 520 are minimized.

One variation of the embodiment of the write current determination circuitry 630 of FIG. 6 includes a switching response of a test magnetic memory cell being used to determine a magnitude of the write current controlled by the up/down counter 610. The response of the test magnetic memory cell can be used to determine the optimal write current for the entire array 520. That is, the response of the test magnetic memory cell can be used to determine the previously described optimal write current range in which the write current is great enough to provide reliable writing to a selected memory cell within the array of magnetic memory cells 520, but small enough that half select errors within the array of magnetic memory cells are minimized. Other methods of determining the minimum and maximum write currents can be used.

The up/down counter 610 is pre-loadable. That is, the controller can pre-load the up/down counter with a count value. An iDAC 615 associated with the up/down counter generally includes a reference current that can be adjusted with a plus or minus offset current. The iDAC 615 generates the write current based upon the reference current and the count value of the up/down counter 610.

Figure 7:
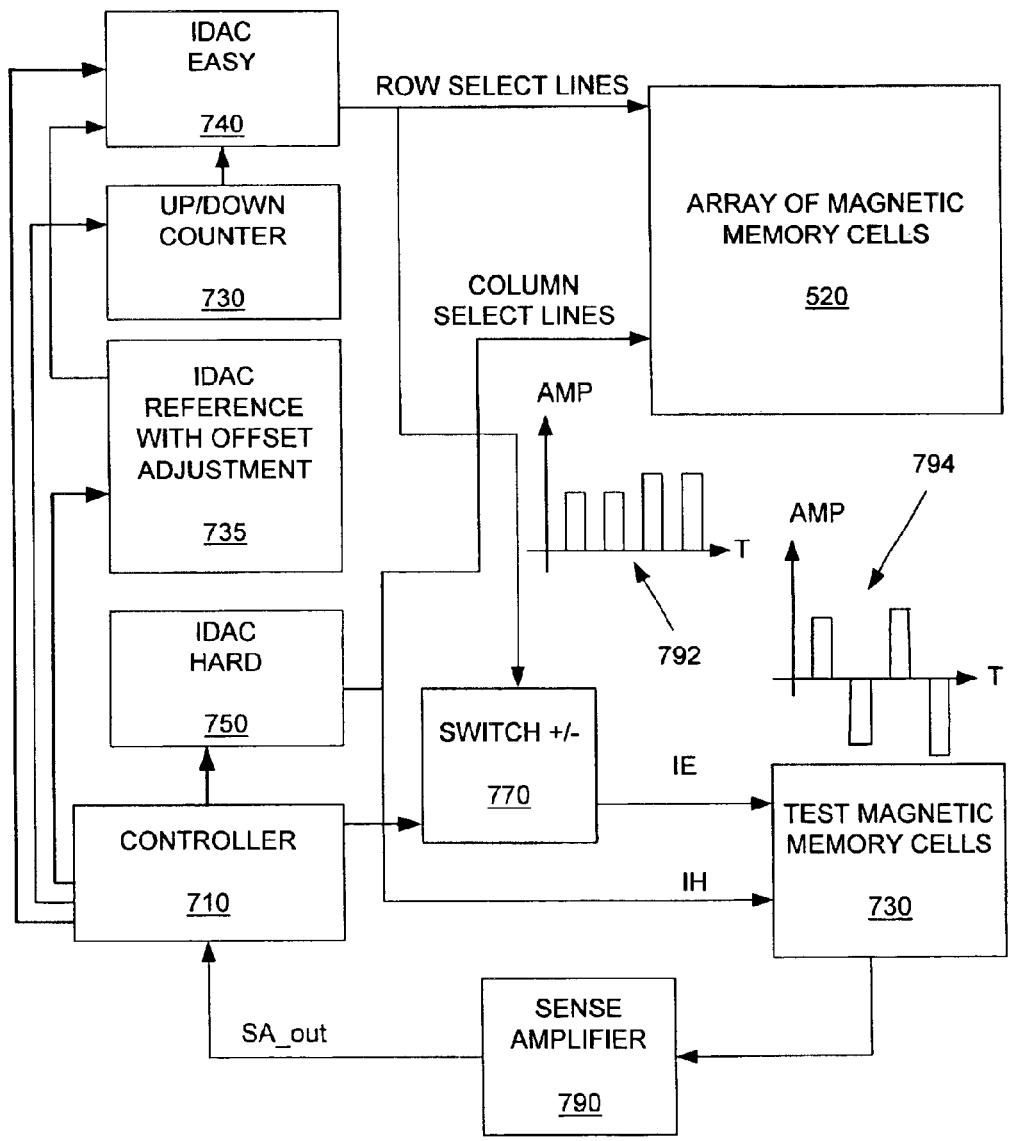
FIG. 7 shows memory array write mechanism that implements additional principles of the invention.

FIG. 7 shows an embodiment similar to FIG. 6, but where one other write current regulation circuit is presented in even more detail. The write current generator of this embodiment includes an easy axis current digital to analog converter (iDAC) 740 and a hard axis iDAC 750. The easy axis iDAC 740 and the hard axis iDAC 750 generate a series of pulsed write signals as shown in the plot 792. The pulses are in the form of a current that can induce a magnetic field.

An easy axis switch 770 receives the pulsed write signals (792) of the easy axis iDAC 740, and alternates that polarity of the pulses. That is, the easy axis switch 770 generates a switch output that includes the pulsed write signal of the easy axis iDAC 740 in which the polarity (positive and negative) of the pulsed signal (shown as 794) alternates from one pulse to the next.

This embodiment does not include a hard axis switch. The uni-polarity pulsed write signals of the hard axis iDAC 750 are coupled to the test magnetic memory cells 730.

The alternating polarity pulses of the easy axis iDAC 740 and the easy axis switch 770, provide an alternating polarity pulsed magnetic field that is along the easy axis of the test magnetic memory cells 730. The uni-polarity pulses of the hard axis iDAC 750 provide a uni-polarity pulsed magnetic field that is along the hard axis of the test magnetic memory cells 730.

A controller 710 provides timing and amplitude control of the easy axis iDAC 740 and the hard axis iDAC 750. A sense amplifier 790 senses the logical states of the test magnetic memory cells 730. The sense amplifier 790 is connected to the controller, so the controller can determine the logical state of the test magnetic memory cells 730.

A count value of the up/down counter 730 determines a digital value that is used to set the magnetic memory cell write current provided by the easy axis iDAC 740. The count value can be loaded, incremented or decremented as determined by the controller 710.

The iDAC 740 is provided with a reference current by an iDAC reference with offset adjustment block 735. The reference current and the digital value provided to the iDAC directly determine the magnitude of the easy axis write current. The offset adjustment block 735 include electronic circuitry to provide the reference current having at least two selectable offsets. Generally, the offsets include a positive reference current offset and a negative reference current offset. The magnitudes of the positive offset and the negative offset do not have to be equal. The negative and positive offset allow for the magnetic memory cell write current regulating tests.

Regulating of the write current provides for an optimal write current when the switching response of the magnetic memory cells vary over time. As previously stated, the magnetic memory cell write current required to write to magnetic memory cells, and the magnetic memory cell write current that causes half-select errors, can both vary over time.

An embodiment includes maintaining the hard axis write current to test a margin in the magnitude of the write current. A negative offset is added to the soft axis write current of the easy axis iDAC 740 by the offset block 735. If the magnetic memory cell (can be a test magnetic memory cell) continues to change magnetic orientations (changes states) when the write current is applied, then the soft axis write current has an acceptable margin of easy axis write current. However, if the magnetic memory cell stops changing states when the soft axis write current is applied, the margin of easy axis write current may be too small. The margin can be increased to an acceptable amount by incrementing the up/down counter 730. Once the magnetic memory cell starts changing states again, the margin is acceptable, and the incrementing of the up/down counter can be stopped. The negative offset is then eliminated.

Another embodiment includes zeroing the hard axis write current. The easy axis write current is then tested to determine a half-select error easy axis write current margin. A positive offset is added to the soft axis write current of the easy axis iDAC 740 by the offset block 735. If the magnetic memory cell (can be a test magnetic memory cell) does not change magnetic orientations (changing states) when the write current is applied, then the soft axis write current has an acceptable half select margin of easy axis write current. However, if the magnetic memory cell changes states when the soft axis write current is applied, the half select margin of easy axis write current may be too small. The margin can be increased to an acceptable amount by decrementing the up/down counter 730. Once the magnetic memory cell stops changing states again, the half-select margin is acceptable, and the decrementing of the up/down counter can be stopped. The positive offset is then eliminated The two previously described embodiments for regulating the magnetic memory cell write current can be performed in any desirable order. That is the order of performing the magnetic memory cell write current regulating tests is not critical. Generally, both tests should be executed to ensure reliable writing to the magnetic memory cells while minimizing half-select errors. If one or both of the tests fail, then reliable writing to the magnetic memory cells cannot be guaranteed.

Figure 8:
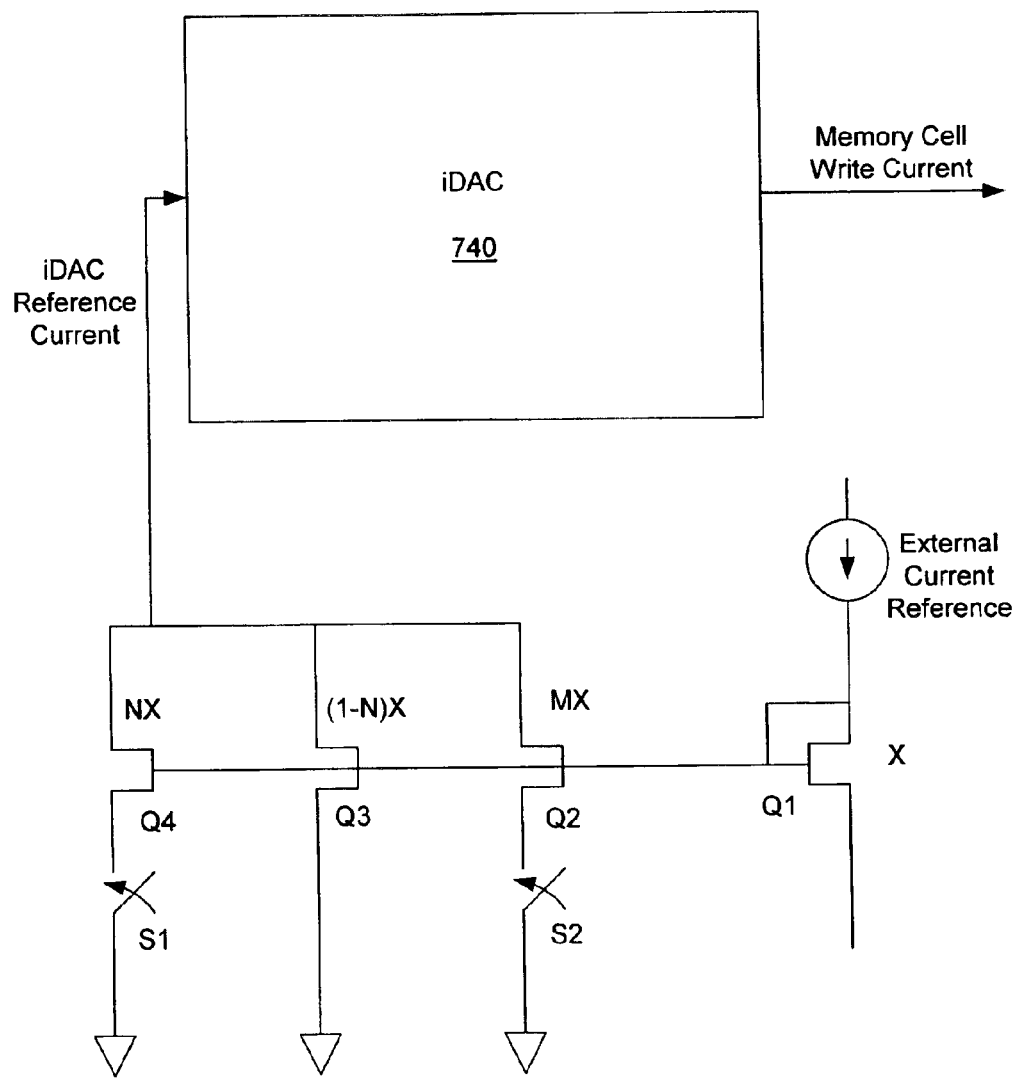
FIG. 8 shows the iDAC and an exemplary embodiment of offset adjustment circuitry.

FIG. 8 shows an exemplary embodiment of the iDAC 740 and offset adjustment circuitry. This embodiment includes a plurality of transistors Q1, Q2, Q3, Q4 that can selectively include a positive or negative offset in the iDAC reference current.

A first transistor Q1 is biased with a stable, constant external current reference. The first transistor includes a channel width of X. A second transistor Q2 includes a channel width of MX. A third transistor Q3 includes a channel width (1-N)X. A fourth transistor Q4 includes a channel width NX. A first switch S1 provides for the selection of the fourth transistor Q4. A second switch S2 provides for the selection of the second transistor Q2. The switches S1, S2 can be used to select whether the iDAC reference current includes a positive or negative offset A negative offset can be added to the iDAC reference current by opening both of the switches S1, S2. The iDAC reference current in this condition is iDACref=(((1-N) X)/X) *(external reference current)=1-N times the external current reference. Therefore, the offset current is dependent upon N.

A positive offset can be added to the iDAC reference current by closing both of the switches S1, S2. Here, the iDAC reference current can be calculated as iDACref= ((NX+(1-N)X+MX)/X)*(external reference current)=1+M times the external current reference. Therefore, offset current is dependent on M.

No offsets are added to the iDAC reference current by closing the first switch S1, and opening the second switch S2. The iDAC reference current can be calculated as iDACref=((NX+(1-N)X)/X)*(external reference current)=1 times the external current reference. Therefore, offset current is not dependent upon N or M.

Other embodiments for providing an offset (positive or negative) to the iDAC reference current can be implemented. The positive and negative offsets do not have to be equal. Optimal values of positive and negative offsets can be experimentally determined, or estimated through simulations.

Figure 9:
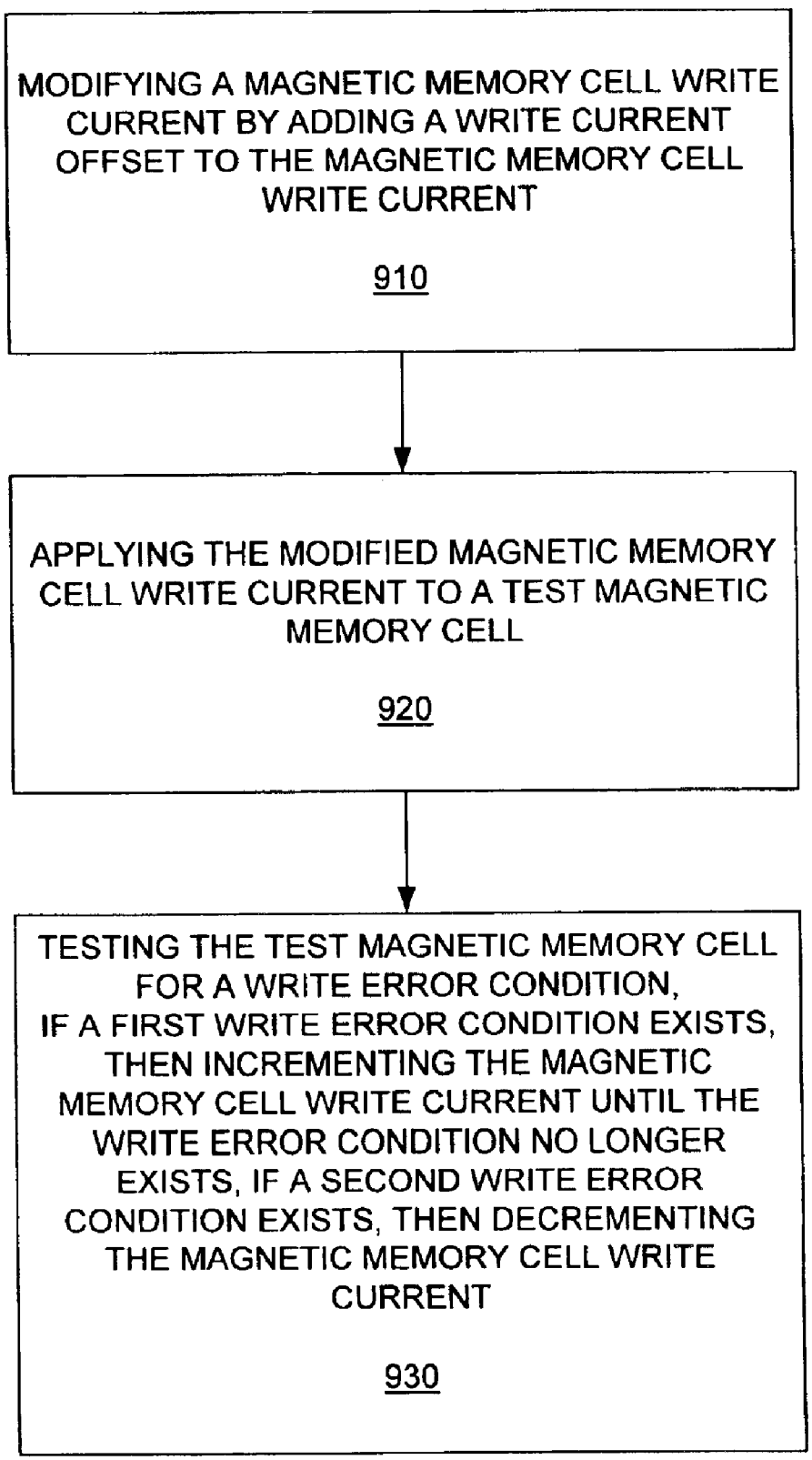
FIG. 9 shows a method for regulating a write current for a magnetic memory cell according to an embodiment of the invention.

FIG. 9 shows an exemplary method for regulating a write current for a magnetic memory. A first block 910 includes modifying a magnetic memory cell write current by adding a write current offset to the magnetic memory cell write current. A second block 920 includes applying the modified magnetic memory cell write current to a test magnetic memory cell. A third block 930 includes testing the test magnetic memory cell for a write error condition. If a first write error condition exists, then the magnetic memory cell write current is incremented until the first write error condition no longer exists. If a second write error condition exists, then the magnetic memory cell write current is decremented until the second write error condition no longer exists.

Changes in Magnetic Memory Cell Switching

Figure 10:
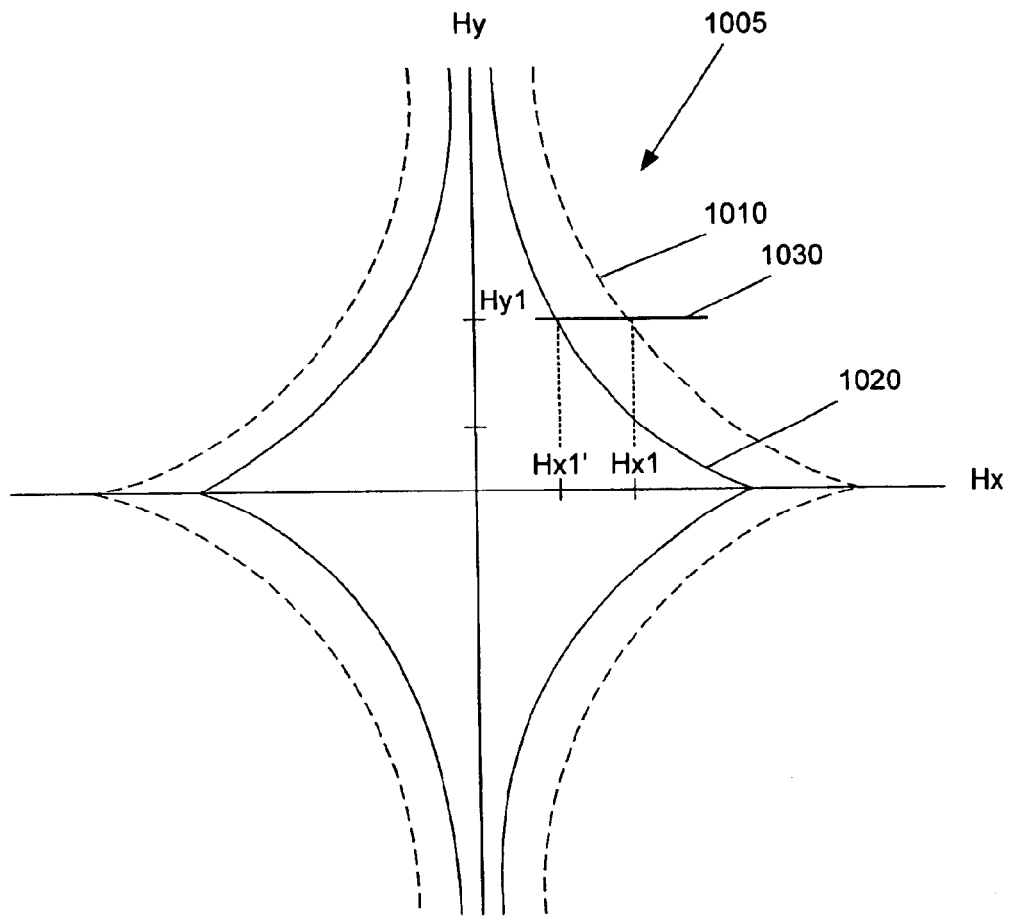
FIG. 10 is a plot showing an intensity of externally applied magnetic fields required to cause an MRAM memory cell to change states, for two different MRAM cell temperatures.

FIG. 10 is a plot showing an intensity of externally applied magnetic fields required to cause an MRAM memory cell to change states, for two different MRAM cell temperatures. A first curve 1010 represents the magnetic field intensity required to change or flip the magnetic orientation of a magnetic tunnel junction for a first temperature. A second curve 1020 represents the magnetic field intensity required to change of flip the magnetic orientation of a magnetic tunnel junction for a second temperature.

It is to be understood, that changes in the switching curves can be due to other reasons than temperature. For example, the switching curves could also change due to aging.

The effect of temperature on the ability to change to the state of the magnetic tunnel junction can be observed by observing the required Hx magnetic field required to change the state of the magnetic tunnel junctions for a fixed Hy magnetic field as depicted by line 1030. As depicted by line 1030 and curve 1010, for a fixed Hy magnetic field of Hy1, the required Hx magnetic field intensity is Hx1 for the first temperature. As depicted by line 1030 and curve 1020, for a fixed Hy magnetic field of Hy1, the required Hx magnetic field intensity is Hx1' for the second temperature. Hx1' is less than Hx1 when the second temperature is greater than the first temperature. Variations in the switching curves of the magnetic memory cells can require that the optimal write current be updated or modified over time or temperature.

Figure 11A:
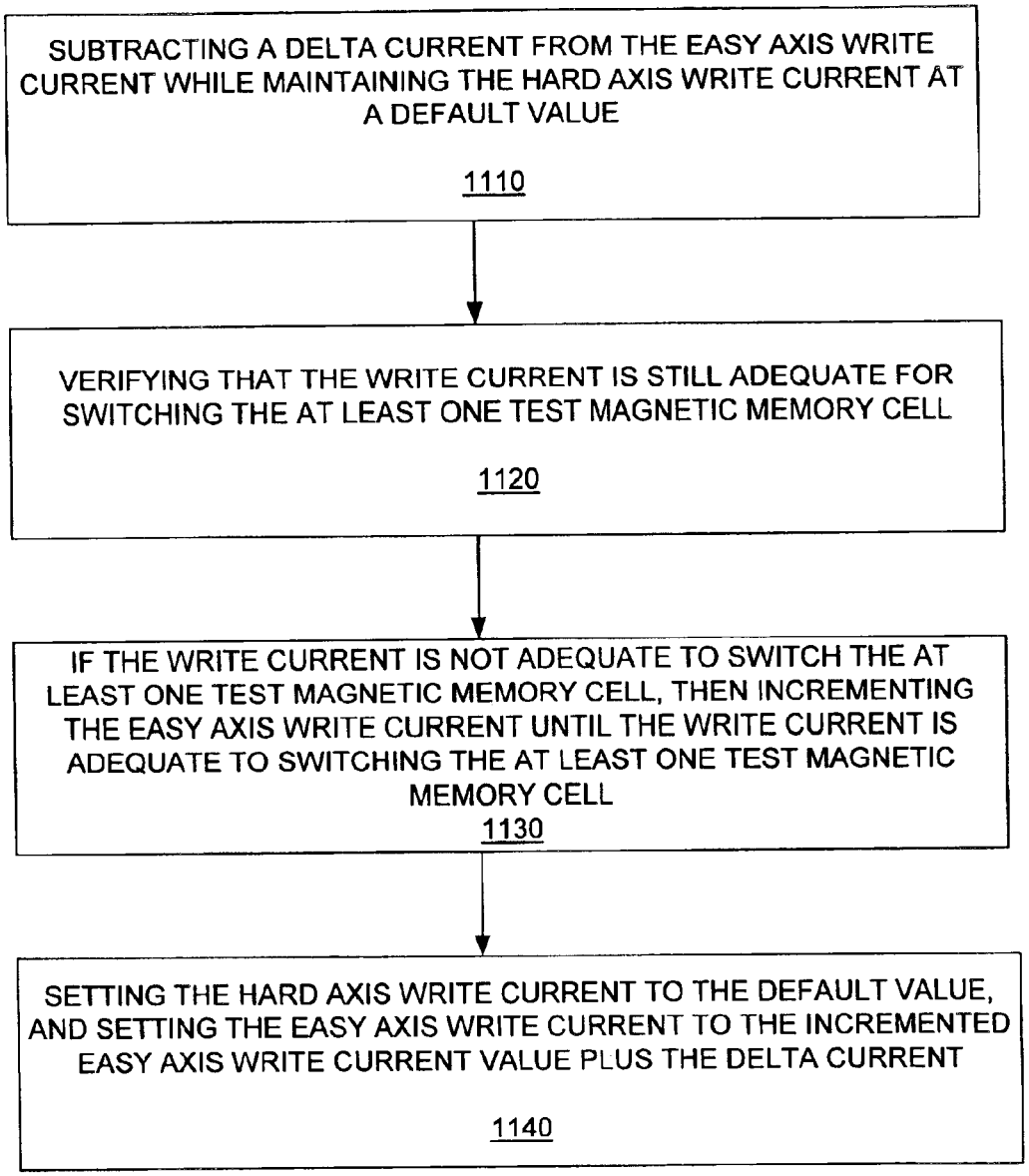
FIG. 11A shows one method of regulating a magnetic memory write current according to an embodiment of the invention.

FIG. 11A shows an exemplary method of regulating a magnetic memory write current according to an embodiment of the invention. The method includes periodically re-calibrating the magnetic memory cell write current. A first block 1110 includes subtracting a delta current from the easy axis write current while maintaining the hard axis write current at a default value. A second block 1120 includes verifying that the write current is still adequate for switching the at least one test magnetic memory cell. A third block 1130 includes if the write current is not adequate to switch the at least one test magnetic memory cell, then incrementing the easy axis write current until the write current is adequate to switching the at least one test magnetic memory cell. A fourth block 1140 includes setting the hard axis write current to the default value, and setting the easy axis write current to the incremented easy axis write current value plus the delta current. Desired values for the default hard axis current, the delta current and the resolution of the increment values can be estimated and characterized depending upon the physical characteristics and materials used in the magnetic memory cells.

Figure 11B:
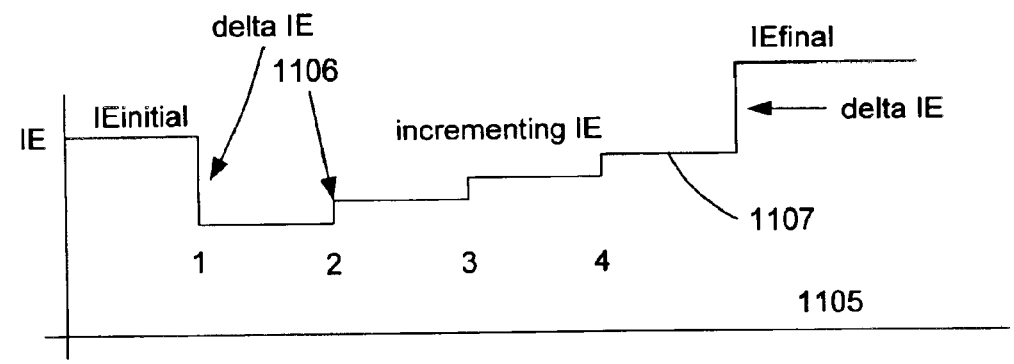
FIG. 11B shows time lines of an easy axis write current and a hard axis write current during a method of write current regulating according to an embodiment of the invention.
Figure 11B:
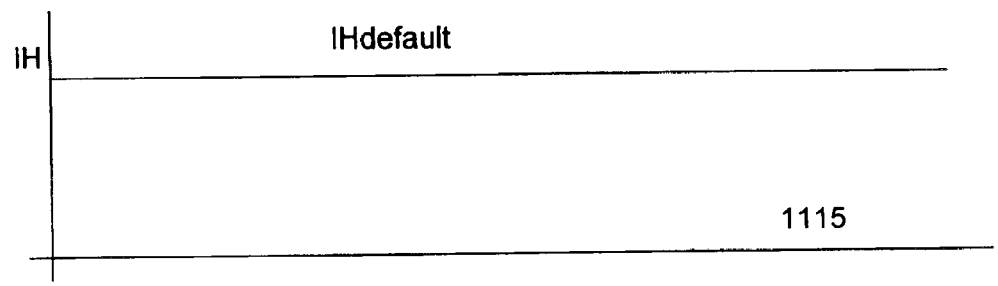
Figure 11B:
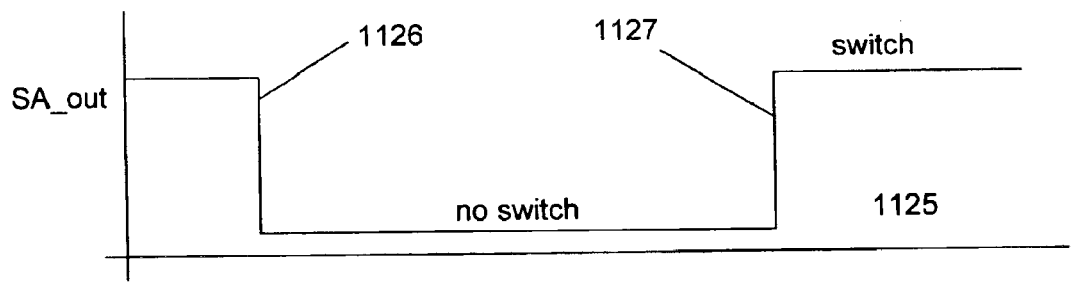

FIG. 11B shows time lines of an easy axis write current and a hard axis write current during a method of write current regulating. A first time line 1105 shows the easy axis write current during the method of regulating the write current. A second time line 1115 shows the hard axis write current during the method of regulating the write current. A third time line 1125 shows a state (SA_out) of the test magnetic memory cell during the method of regulating the write current.

The easy axis write current (time line 1105) starts at an initial value. A delta current value is then subtracted from the easy axis current. If the state (SA_out) of the test magnetic memory cells stops switching (shown at point 1126 of time line 1125 of FIG. 11B), then the easy axis current is incremented (point 1106). As the easy axis current is incremented, eventually the state of the test magnetic memory cells begins to switch (point 1127). In FIG. 11B, the test magnetic memory cells begin to switch after the fourth (4) increment (point 1107) of the easy axis current. When the test magnetic memory cells begin switching, incrementing of the easy axis current is halted. The delta current value is then added to the easy axis write current. The method of regulating a magnetic memory write current of FIGS. 11A, 11B is intended to ensure that the write current is great enough to ensure proper writing of the magnetic memory cells.

Figure 12A:
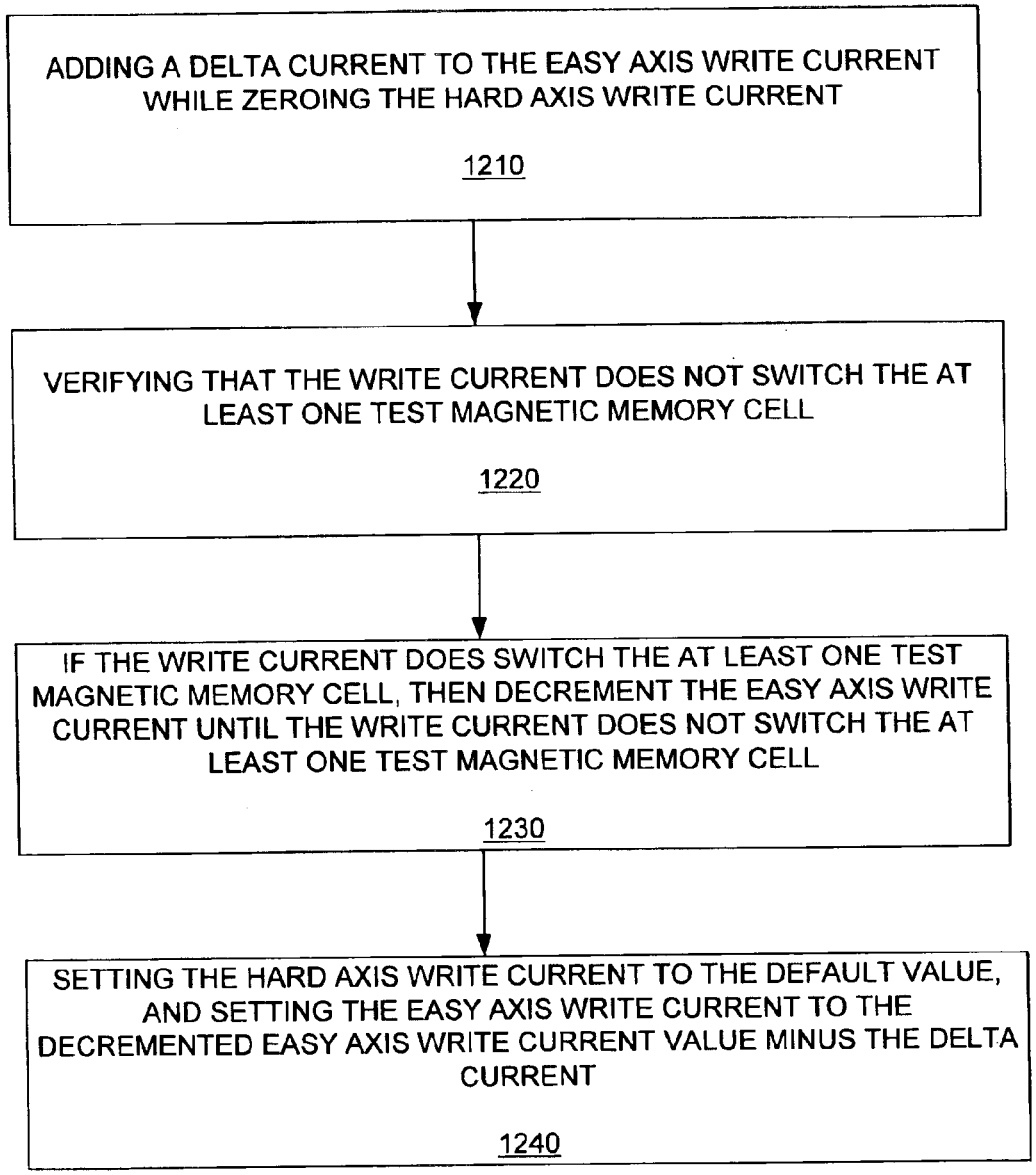
FIG. 12A shows another method of regulating a magnetic memory write current according to an embodiment of the invention.

FIG. 12A shows another exemplary method of regulating a magnetic memory write current. Regulating the write current includes periodically re-calibrating the write current. A first block 1210 includes adding a delta current to the easy axis write current while zeroing the hard axis write current. A second block 1220 includes verifying that the write current does not switch the at least one test magnetic memory cell. A third block 1230 includes if the write current does switch the at least one test magnetic memory cell, then decrement the easy axis write current until the write current does not switch the at least one test magnetic memory cell. A fourth block 1240 includes setting the hard axis write current to the default value, and setting the easy axis write current to the decremented easy axis write current value minus the delta current. Desired values for the default hard axis current, the delta current and the resolution of the decrement values can be estimated and characterized depending upon the physical characteristics and materials used in the magnetic memory cells.

Figure 12B:
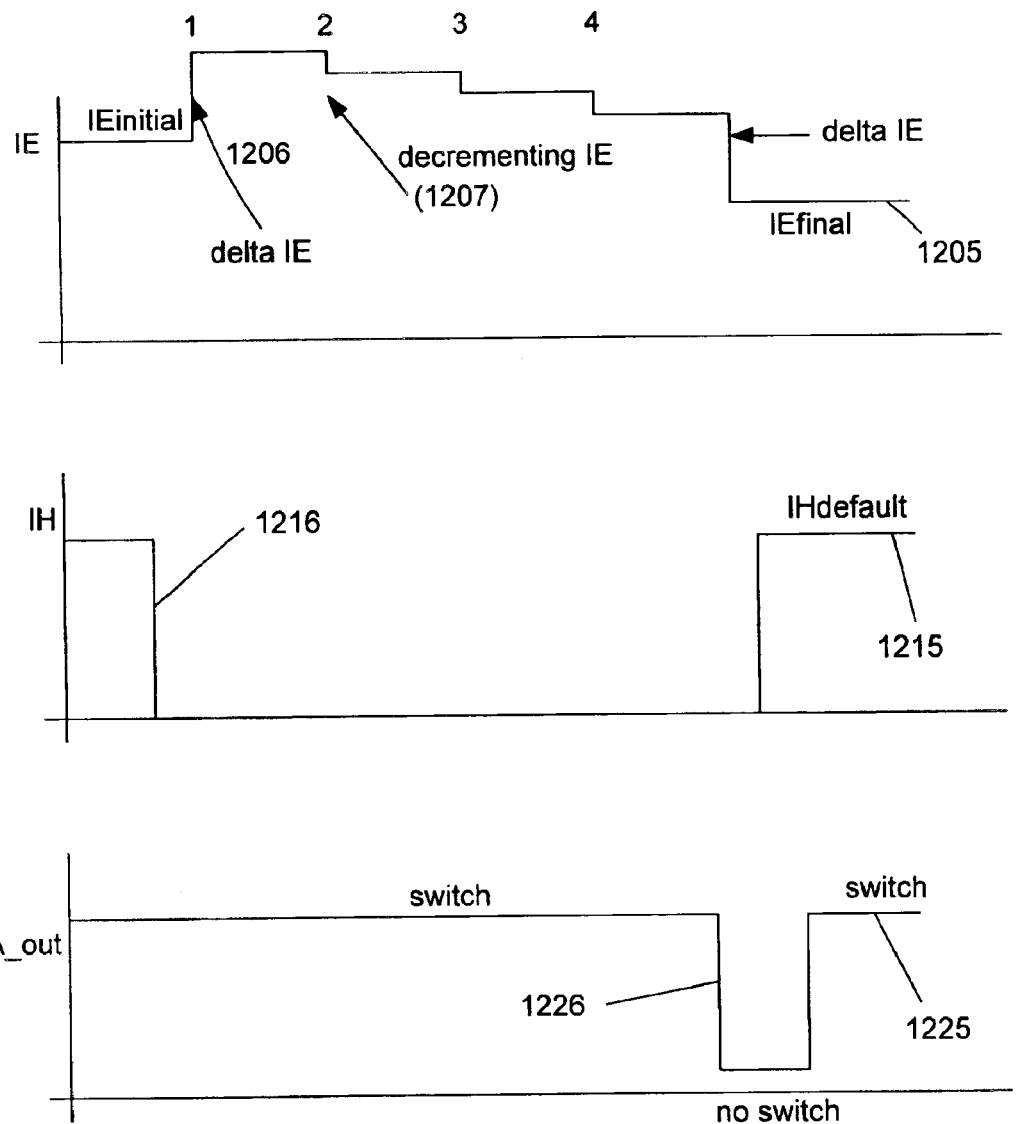
FIG. 12B shows time lines of an easy axis write current and a hard axis write current during a method of write current regulating according to an embodiment of the invention.

FIG. 12B shows time lines of an easy axis write current and a hard axis write current during a method of write current regulating. A first time line 1205 shows the easy axis write current during the method of regulating the write current. A second time line 1215 shows the hard axis write current during the method of regulating the write current. A third time line 1225 shows a state of a test magnetic memory cells during the method of regulating the write current.

The easy axis write current (time line 1205) starts at an initial value. The hard axis write current is set to zero (point 1216 of time line 1215). A delta current value is then added to the easy axis current (point 1206). If the state (SA_out) of the test magnetic memory cells does not stop switching (as shown by time line 1225 of FIG. 12B), then the easy axis current is decremented (as indicated by the designator 1207). As the easy axis current is decremented, eventually the state of the test magnetic memory cells begins to stop switching (point 1226). In FIG. 12B, the test magnetic memory cells stops switching after the fourth (4) decrement of the easy axis current. When the test magnetic memory cells stops switching, decrementing of the easy axis current is halted. The delta current value is then subtracted from the easy axis write current, and the hard axis write current is set to the default value. The method of regulating a magnetic memory write current of FIGS. 12A, 12B is intended to ensure that the write current is small enough to minimize half-select errors when writing to the magnetic memory cells.

Although specific embodiments of the invention have been described and illustrated, the invention is not to be limited to the specific forms or arrangements of parts so described and illustrated. The invention is limited only by the appended claims.

What is claimed:

1. An apparatus for writing to memory cells comprising:
   a write current generator for generating a write current that is coupled to an array of memory cells;
   a threshold detector for feeding back a control indicator to the write current generator if the write current is one of greater than a maximum write current threshold or less than a minimum write current threshold.

2. The apparatus of claim 1, wherein the threshold detector determines whether the write current is greater than a maximum write current threshold or less than a minimum write current threshold by summing a write current offset to the write current, and determining whether a write error occurs.

3. The apparatus of claim 2, wherein the write current offset increases the write current to determine whether a magnitude of the write current should be decreased.

4. The apparatus of claim 2, wherein the write current offset decreases the write current to determine whether a magnitude of the write current should be increased.

5. A method for regulating a magnetic memory cell write current, comprising:

modifying a magnetic memory cell write current by summing a write current offset to the magnetic memory cell write current;
   determining whether writing to a magnetic memory cell with the modified magnetic memory cell write current results in a write error condition;
   if a write error condition exists, then incrementing the magnetic memory cell write current, or decrementing the magnetic memory cell write current, until the write error condition is eliminated.

6. The method for regulating a magnetic memory cell write current of claim 5, wherein the write current offset decreases the magnetic memory cell write current to determine whether a magnitude of the magnetic memory cell write current should be increased.

7. The method for regulating a magnetic memory cell write current of claim 5, wherein the write current offset increases the magnetic memory cell write current to determine whether a magnitude of the magnetic memory cell write current should be decreased.

8. The method for regulating a magnetic memory cell write current of claim 5, wherein the magnetic memory cell write current comprises an easy axis current and a hard axis current, the hard axis current being set to a default value, and the easy axis current being incremented.

9. The method for regulating a magnetic memory cell write current of claim 6, wherein the magnitude of the magnetic memory cell write current is increased by incrementing an up/down counter.

10. The method for regulating a magnetic memory cell write current of claim 7, wherein the magnitude of the magnetic memory cell write current is decreased by decrementing an up/down counter.

11. The method for regulating a write current for a magnetic memory cell of claim 7, wherein the magnetic memory cell write current comprises an easy axis current and a hard axis current, the hard axis current being zeroed, and the easy axis current being decremented.

12. The method for regulating a magnetic memory cell write current of claim 9, the up/down counter is connected to a current digital to analog converter (iDAC) that generates the magnetic memory cell write current.

13. The method for regulating a magnetic memory cell write current of claim 12, wherein the write current offset is subtracted from the magnetic memory cell write current by subtracting a current offset from a current reference of iDAC.

14. The method for regulating a magnetic memory cell write current of claim 13, wherein the current offset is subtracted from a current reference of iDAC by selecting which transistors of a plurality of transistor are connected in parallel in a current mirror, wherein the current mirror generates the current reference.

15. The method for regulating a magnetic memory cell write current of claim 14, the up/down counter is connected to a current digital to analog converter (iDAC) that generates the magnetic memory cell write current.

16. The method for regulating a magnetic memory cell write current of claim 15, wherein the write current offset is added to the magnetic memory cell write current by adding a current offset to a current reference of iDAC.

17. The method for regulating a write current for a magnetic memory cell of claim 16, wherein the current offset is added to a current reference of iDAC by selecting which transistors of a plurality of transistor are connected in parallel in a current mirror, wherein the current mirror generates the current reference.

18. An magnetic random access memory (MRAM) array comprising:
 an MRAM cell;
 a write current generator for generating a MRAM cell write current for writing to the MRAM cell; and
 a write current monitor for maintaining a magnitude of the write current within a minimal write error range.

19. The MRAM array of claim 18, wherein the write current monitor maintains the magnitude of the write current within the minimal write error range by summing a write current offset to the write current, determining whether a write error occurs, and incrementing or decrementing the write current until the error condition is eliminated.

20. The MRAM array of claim 19, wherein the write current offset increases the write current to determine whether a magnitude of the write current should be decreased.

21. The MRAM array of claim 19, wherein the write current offset decreases the write current to determine whether a magnitude of the write current should be increased.

22. The MRAM array of claim 20, wherein the magnitude of the write current is increased by incrementing an up/down counter.

23. The MRAM array of claim 21, wherein the magnitude of the write current is decreased by decrementing an up/down counter.

24. A method for regulating a write current for a magnetic memory cell, comprising
 modifying a magnetic memory cell write current by adding a write current offset to the magnetic memory cell write current;
 applying the modified magnetic memory cell write current to a test magnetic memory cell;
 testing the test magnetic memory cell for a write error condition;
 if a write error condition exists, then incrementing the magnetic memory cell write current, or decrementing the magnetic memory cell write current, until the write error condition no longer exists.

25. The method for regulating a write current for a magnetic memory cell of claim 24, wherein the write current offset decreases the magnetic memory cell write current to determine whether a magnitude of the magnetic memory cell write current should be increased.

26. The method for regulating a write current for a magnetic memory cell of claim 24, wherein the write current offset increases the magnetic memory cell write current to determine whether a magnitude of the magnetic memory cell write current should be decreased.

27. The method for regulating a write current for a magnetic memory cell of claim 25, wherein the magnitude of the magnetic memory cell write current is increased by incrementing an up/down counter.

28. The method for regulating a write current for a magnetic memory cell of claim 25, wherein the magnetic memory cell write current comprises an easy axis current and a hard axis current, the hard axis current being set to a default value, and the easy axis current being incremented.

29. The method for regulating a write current for a magnetic memory cell of claim 26, wherein the magnitude of the magnetic memory cell write current is decreased by decrementing an up/down counter.

30. The method for regulating a write current for a magnetic memory cell of claim 28, the up/down counter is connected to a current digital to analog converter (iDAC) that generates the magnetic memory cell write current.

31. The method for regulating a write current for a magnetic memory cell of claim 30, wherein the write current offset is subtracted from the magnetic memory cell write current by subtracting a current offset from a current reference of iDAC.

32. The method for regulating a write current for a magnetic memory cell of claim 31, wherein the current offset is subtracted from a current reference of iDAC by selecting which transistors of a plurality of transistor are connected in parallel in a current mirror, wherein the current mirror generates the current reference.

33. An apparatus for regulating a write current for a magnetic memory cell comprising:
 a write current generator for generating a write current, the write current being magnetically coupled to the magnetic memory cell;
 at least one test magnetic memory cell, the write current being magnetically coupled to the at least one test magnetic memory cell;
 wherein the write current generator includes;
  an up/down counter that controls a magnitude of the write current generated by an iDAC.

34. The apparatus for generating a write current of claim 33, wherein the write current generator further comprises a current mirror for providing a reference current to the iDAC.

35. The apparatus for generating a write current of claim 34, wherein the current mirror comprises a plurality of parallel transistors, wherein an offset current can be added to the reference current by selecting which of the plurality of transistors are conducting.

36. The apparatus for generating a write current of claim 34, wherein the write current being magnetically coupled to the at least one test magnetic memory cell comprises a continuous series of pulses, in which the pulses alternate in polarity.

37. The apparatus for generating a write current of claim 34, further comprising a test magnetic memory cell state detector for detecting a logical state of the at least one test magnetic memory cell, an output of the test magnetic memory cell state detector being fed back to the write current generator.

38. The apparatus for generating a write current of claim 34, wherein the write current generator comprises an easy axis write current and a hard axis write current.

39. The apparatus for generating a write current of claim 34, wherein the write current is monitored over time.

40. The apparatus for generating a write current of claim 33, wherein the write current is re-calibrated upon detection of a predetermined variation in a temperature of the apparatus.

41. The apparatus for generating a write current of claim 33, wherein a negative offset current is added to the reference current, and if a write test to the at least one test magnetic memory cell fails, the up/down counter is incremented until the write test is passed.

42. The apparatus for generating a write current of claim 35, wherein a positive offset current is added to the reference current, and if a write test to the at least one test magnetic memory cell fails, the up/down counter is decremented until the write test is passed.

43. An array of magnetic memory cells, the array comprising an apparatus for generating a write current for writing to the magnetic memory cells, the apparatus comprising:
 a write current generator for generating a write current, the write current being magnetically coupled to the magnetic memory cell;

at least one test magnetic memory cell, the write current being magnetically coupled to the at least one test magnetic memory cell; wherein a switching response of the at least one test magnetic memory cell determines a magnitude of the write current generated by the write current generator;

wherein the write current generator includes;

an iDAC that generates the write current;

an up/down counter that controls the iDAC.

44. An apparatus for regulating a write current for a magnetic memory cell comprising:

means for modifying a magnetic memory cell write current by summing a write current offset to the magnetic memory cell write current;

means for determining whether writing to a magnetic memory cell with the modified magnetic memory cell write current results in a write error condition;

means for incrementing the magnetic memory cell write current, or decrementing the magnetic memory cell write current, until the write error condition is eliminated.

* * * * *